(12) United States Patent
Mukai

(10) Patent No.: US 6,682,833 B1
(45) Date of Patent: Jan. 27, 2004

(54) MAGNETIC RECORDING MEDIUM AND PRODUCTION PROCESS THEREOF

(75) Inventor: Ryoichi Mukai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/524,688

(22) Filed: Mar. 14, 2000

(30) Foreign Application Priority Data

Mar. 19, 1999 (JP) ............................................. 11-075961

(51) Int. Cl.⁷ ............................. G11B 5/66; G11B 5/70; C23C 14/00; C23C 14/34
(52) U.S. Cl. ................................ 428/694 TS; 428/336; 428/900; 204/192.2
(58) Field of Search ........................... 428/694 TS, 900, 428/336; 204/192.1, 192.15, 192.2

(56) References Cited

U.S. PATENT DOCUMENTS

| | | | |
|---|---|---|---|
| 6,007,623 A | * 12/1999 | Thiele et al. | 117/95 |
| 6,146,755 A | * 11/2000 | Guha et al. | 428/332 |
| 6,242,085 B1 | * 6/2001 | Ryonai et al. | 428/332 |
| 6,248,416 B1 | * 6/2001 | Lambeth et al. | 428/65.3 |
| 6,277,484 B1 | * 8/2001 | Shimoda et al. | 428/332 |
| 6,403,203 B2 | * 6/2002 | Futamoto et al. | 428/212 |

FOREIGN PATENT DOCUMENTS

| | | |
|---|---|---|
| JP | 8-221734 | 8/1996 |
| JP | 08-306029 | * 11/1996 |
| JP | 9-81928 | 3/1997 |
| JP | 09-081928 A | * 3/1997 |
| JP | 9-293227 | 11/1997 |
| JP | 9-320033 | 12/1997 |
| JP | 10-241144 | 9/1998 |
| WO | WO 96/27187 | 9/1996 |
| WO | WO 96/27877 | 9/1996 |
| WO | WO 96/27878 | 9/1996 |

\* cited by examiner

*Primary Examiner*—Holly Rickman
(74) *Attorney, Agent, or Firm*—Armstrong, Kratz, Quintos, Hanson & Brooks, LLP

(57) ABSTRACT

A magnetic recording medium comprising a non-magnetic base and a non-magnetic underlayer and a magnetic layer formed in that order on the base, the uniderlayer comprises a non-magnetic polycrystalline material and the magnetic layer comprises magnetic CoCr-based alloy particles, wherein the planar size of the magnetic alloy particles is defined by the planar size of the polycrystalline particles composing the underlayer, and is no greater than 20 nm. The magnetic recording medium is useful for HDDs in particular, having a very high magnetic coercive force and being capable of high recording density.

7 Claims, 2 Drawing Sheets

MAGNETIC RECORDING MEDIUM AND PRODUCTION PROCESS THEREOF

CROSS-REFERENCE TO RELATED APPLICATIONS

This application is based upon and claims priority of Japanese Patent Application No. 11-75961 filed Mar. 19, 1999, the contents being incorporated herein by reference.

BACKGROUND OF THE INVENTION

1. Field of the Invention

The present invention relates to a magnetic recording medium and, more specifically, it relates to a magnetic recording medium that can be advantageously used for hard disk drive (hereinafter, referred to as "HDD") devices in computers. The present invention also relates to a process for the production of the magnetic recording medium.

2. Description of the Prior Art

As is well-known, magnetic recording media are constructed with a non-magnetic base and a magnetic layer, i.e. a thin film of a magnetic recording material, formed on the base, and an underlayer is usually formed between the non-magnetic base and the magnetic layer in order to control the crystal orientation of the magnetic particles composing the magnetic layer. More specifically, the most commonly used form of magnetic recording medium at the current time has an underlayer of chromium (Cr), titanium (Ti) or an alloy composed mainly thereof formed on a non-magnetic base such as a glass or silicon plate, and a magnetic layer made of a cobaltchromium (hereinafter, "CoCr")-based alloy, composed mainly of Co, formed on the underlayer.

Incidentally, with the remarkable increase in HDD capacities in recent years, demands have been increasing for improved recording densities, or higher recording densities, in the magnetic recording media used therein as well. Realization of such higher recording density has required the magnetic layers in the magnetic recording media to be designed with smaller thicknesses, higher resolution, greater magnetic coercive force and lower noise. In other words, the higher density of magnetic recording media has resulted in a reduction in the area of the magnetic layer occupied per bit. Because of this situation, the leakage magnetic field generated from the magnetized region of each bit can only be guaranteed by reducing the thickness of the magnetic layer in conformity with the reduced bit size, to ensure a semicircular arcuate magnetic field state and minimize loss of signal output. Furthermore, because the bit spacings must be narrow, improvement in the magnetic domain structure in the magnetized transition region to reduce noise requires fine crystalline particles, to match the lower thickness, and reduced interaction between magnetic particles. Such noise reduction makes it possible to achieve both higher resolution and higher magnetic coercive force.

In conventionally formed magnetic recording media, Cr is segregated at the crystalline grain boundaries in a CoCr-based alloy polycrystalline film constituting the magnetic layer, and this region is demagnetized to attempt to reduce the interaction between particles. The method of segregating the Cr may be, for example, a method whereby a magnetic layer with a polycrystalline structure is deposited by sputtering on a heated base, and the Cr in the target is segregated at the crystalline grain boundaries during the deposition. Here, the Cr segregation is often promoted by increasing the proportion of Cr added to the magnetic layer alloy, by adding other elements such as Ta that can effectively promote Cr diffusion, or by heating the base at high temperature during deposition of the magnetic layer. A typical temperature for heating of the base is 200–300° C.

However, while employment of such means that promote Cr segregation can provide an effect of promoting Cr segregation and thereby reducing interaction between particles, it also has an adverse effect on fine crystal grain formation which is one of the objects, and therefore it is difficult to achieve and control both simultaneously. In fact, even when the magnetic layer thickness is reduced to a film thickness of 20 nm or less which is necessary to achieve high recording densities of 10 $Gb/in^2$ and greater, it is difficult to realize adequate segregation of Cr with fine crystal grain formation to a planar crystal grain size of 20 nm or less. Also, heating of the base during deposition releases adsorption gas present in the base and the film forming chamber, thus undesirably reducing the degree of vacuum in the chamber, while the gas discharge volume and the type of gas also change depending on the humidity and the state of the adhesion film in the chamber, thus undesirably causing instability in the properties of the formed magnetic layer.

SUMMARY OF THE INVENTION

It is an object of the present invention to overcome the aforementioned problems of the prior art by providing a magnetic recording medium that can be advantageously used, for HDDs in particular, and that can realize high recording density.

It is another object of the invention to provide an advantageous process for production of such a magnetic recording medium.

These and other objects of the invention will become apparent in the detailed description which follows.

According to one aspect of the invention, there is provided a magnletic recording medium comprising a non-maginetic base and a non-magnetic underlayer and a magnetic layer formed in that order on the base, the magnetic recording medium being characterized in that the underlayer comprises a nonmagnetic polycrystalline material, and the magnetic layer comprises magnetic cobaltchromium (CoCr)-based alloy particles, wherein the planar size of the magnetic alloy particles is defined by the planar size of the polycrystalline particles comprising the underlayer, and is no greater than 20 nm.

According to another aspect of the invention, there is also provided a process for production of a magnetic recording medium comprising a nonmagnetic base and a non-magnetic underlayer and a magnetic layer formed in that order on the base, the process for production of a magnetic recording medium being characterized by forming the underlayer by depositing by magnetic polycrystallinie material on the non-magnietic base while the base is in a vacuum under non-heated conditions, and forming the magnetic layer by depositing magnetic CoCr-based alloy particles on the underlayer while the base is in a vacuum under non-heated conditions, wherein the planar size of the magnetic alloy particles is defined by the planar size of the polycrystalline particles composing the uniderlayer, and is no greater than 20 nm.

According to the invention, the aforementioned problems may be solved by employing means whereby a laminated structure is realized wherein the planar size of the crystal grains composing the underlayer determines the planar size of the crystal grains composing the magnetic layer deposited on the upper layer, to control the planar magnetic particle size. Also, by promoting segregation of the non-magnetic metal element at the crystal grain boundaries of the magnetic layer with a polycrystalline structure (hereunder, this will also be referred to as "Cr segregation", for Cr as a typical non-magnetic metal) without altering the laminated structure, it becomes possible to reduce interaction between the particles and thus independently control the Cr segregation and the magnetic particle size. According to the invention, it is useful to employ a medium-forming technique wherein the laminated structure and promoted Cr segregation are accomplished by deposition of the underlayer and magnetic layer on a non-heated base (room temperature deposition; preferably using sputtering as the deposition method), to form the desired laminated structure, followed by post-annealing to promote Cr segregation. In this medium-forming technique, the Cr segregation can be easily controlled by controlling the post-annealing temperature. Control of the planar crystal grain size of the underlayer, which determines the planar size of the magnetic-particles, can be easily accomplished by changing the film thickness and deposition rate of the underlayer. Specifically, it may be accomplished by reducing the thickness of the underlayer or lowering the deposition rate to 5 nm/sec or lower.

The present inventors have discovered a phenomenon whereby, when the planar size of the magnetic particles is 20 nm or smaller and the planar size of the magnetic particles alone is reduced to a fine size while the width of the non-magnetic region at the crystal grain boundaries which is formed by Cr segregation remains the same, the interaction between particles tends to increase, lowering the magnetic coercive force. The present invention, however, attempts to reduce medium noise while increasing the interaction between particles. The aforementioned phenomenon would therefore not be an issue if the problem of lower magnetic coercive force reduction can be solved. The present inventors have found that the problem of lower magnetic coercive force can be solved by adding a higher proportion of Pt to the CoCr-based alloy.

DESCRIPTION OF THE PREFERRED EMBODIMENTS

Preferred embodiments of the invention will now be explained.

Figure 1:
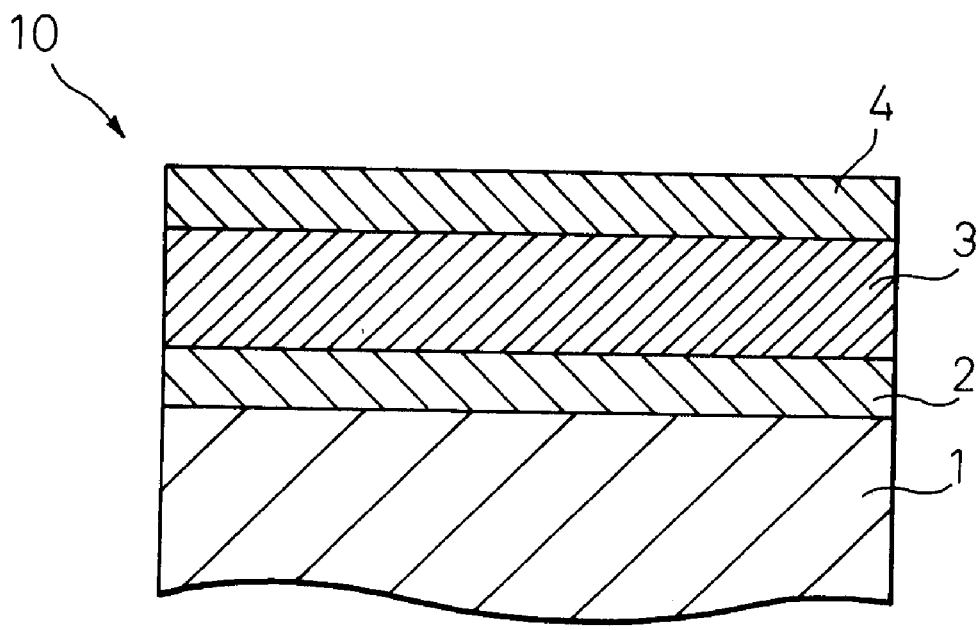
FIG. 1 is a cross-sectional view of a preferred embodiment of the magnetic recording medium of the invention.
Figure 2:
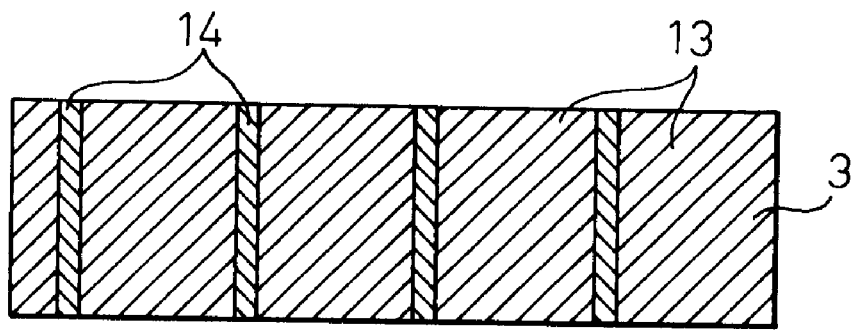
FIG. 2 is a schematic cross-sectional view of the microstructure of magnetic particles in the magnetic layer of the magnetic recording medium shown in FIG. 1.

FIG. 1 is a cross-sectional view of a preferred embodiment of the magnetic recording medium of the invention. The magnetic recording medium 10 has an underlayer 2 made of a non-magnetic polycrystalline material such as Cr or the like laminated on a non-magnetic base 1 such as glass or silicon, and on the underlayer 2 there is further laminated a magnetic layer 3 made of a magnetic CoCr-based alloy, such as CoCrPt or the like. The magnetic layer 3 may have a single-layer structure such as that shown in the drawing or, if possible and desired for improved medium characteristics it may have a two-layered structure composed of an upper layer and lower layer, or another multilayer structure. The magnetic layer 3 is protected by a protective layer 4 made of carbon (C) or the like and, though not shown, a lubricant layer impregnates and coats the protective layer 4. As shown schematically in FIG. 2, the magnetic layer 3 of the magnetic recording medium 10 possesses numerous magnetic particles 13 densely situated with slight gaps opened between the particles.

Figure 3:
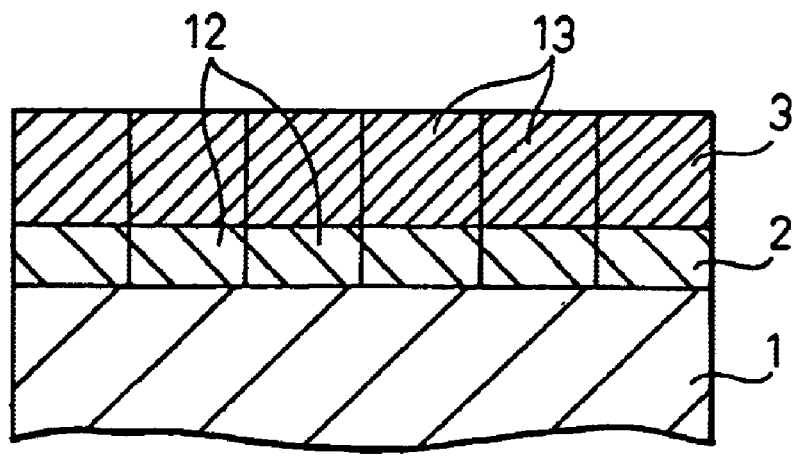
FIG. 3 is a schematic cross-sectional view illustrating the relationship between the planar sizes of the magnetic crystal grains in the underlayer of the magnetic recording-medium shown in FIG. 1, and in the magnetic layer laminated thereover.

When the underlayer and magnetic layer are successively laminated on the base in the magnetic recording medium of the invention as shown schematically in FIG. 3, a situation results wherein the planar size of the magnetic particles 13 of the magnetic layer 3 is defined by the planar size of the polycrystalline particles 12 of the underlayer 2. In a medium having this sort of laminated structure, it is possible to control the planar crystal grain size of the magnetic layer by the planar crystal grain size of the underlayer oil which it is laminated.

Figure 4:
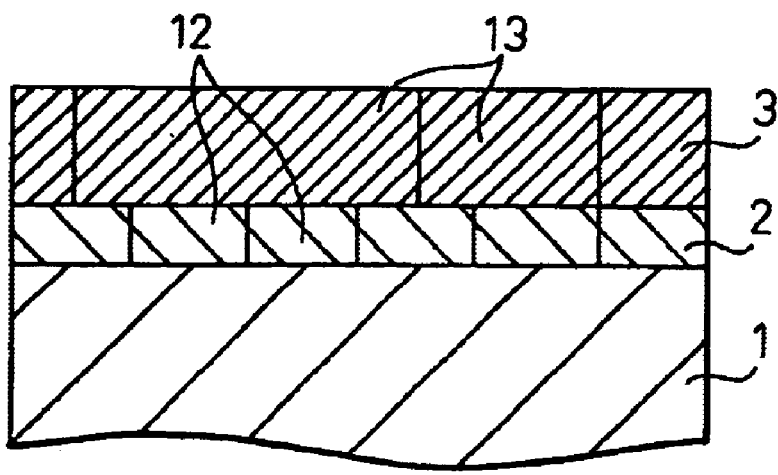
FIG. 4 is a schematic cross-sectional view illustrating the relationship between the planar sizes of the magnetic crystal grains in the underlayer of a conventional magnetic recording medium, and in the magnetic layer laminated thereover.

Such control of the crystal grain size cannot be accomplished with the laminated structures of magnetic recording media according to the prior art. This is because, as shown schematically in FIG. 4, heating of the base 1 during lamination of the magnetic-layer 3 results in activation of the magnetic particles 13 of the magnetic layer 3, so that excessive particle growth (migration) occurs spanning multiple polycrystalline particles 12 of the underlayer 2. As a result, unlike the laminated structure of the present invention, it is not possible to control the planar-crystal grain size of the magnetic layer by the planar crystal grain size of the underlayer.

Moreover, referring again to FIG. 2, in the magnetic recording medium of the invention it is preferred for the non-magnetic metal particles 14 of Cr, Mo, C, etc. to be diffused and segregated at the grain boundaries of the magnetic particles 13 of the magnetic layer 3. Here, the non-magnetic-metal particles that are to be segregated may be contained in the magnetic layer itself or they may be contained in a metal discharge layer formed in direct contact with the underlayer or magnetic layer. The segregation of the non-magnetic metal is preferably accomplished by depositing the magnetic layer on the base in a vacuum under non-heated conditions (or, if segregation of the non-magnetic metal depends on a metal discharge layer, depositing the metal discharge layer) and then further annealing it while maintaining the vacuum state (known as "post-annealing"). Post-annealing is preferably carried out at a heating temperature at which the crystallomagnetic anisotropic magnetic field of the magnetic layer is not reduced, i.e., at which the Cr concentration of the magnetic particles does not increase. If the heating temperature is too high, the diffusion of the non-magnetic metal into the magnetic layer will be excessive and the magnetic layer will be demagnetized, and therefore the annealing temperature is preferably below 600° C. Thus, the heating temperature for the base during annealing is usually preferred to be in the range of 200–550° C., and more preferably in the range of 400–500° C. When carrying out the invention, it is particularly preferred to use, Cr as the non-magnetic metal, in which case the preferred heating temperature is usually about 450° C.

The magnetic recording medium of the invention comprises a non-magnetic base with an underlayer of a non-magnetic material and a magnetic layer made of a CoCr-based magnetic alloy formed thereon in that order; if necessary, it may also include additional layers. Each of the layers is preferably deposited while the base is in a vacuum under non-heated conditions (normal temperature deposition), and sputtering is particularly suitable for the deposition method. The sputtering film formation is preferably carried out under a gas pressure of 3 mTorr, in the presence of an inert gas such as argon (Ar).

In the magnetic recording medium of the invention, the non-magnetic base used as the base may be constructed of any of various base materials commonly used in the relevant technical field. However, since the base used here is subjected to annealing after film formation, i.e. post-annealing, in order to achieve high magnetic coercive force for production of the magnetic recording medium of the invention, it must be able to withstand the temperature at that time. Suitable bases include, but are not limited to, such examples as surface oxide film (for example, silic on oxide ($SiO_2$) films)-coated silicon bases, SiC bases, carbon bases, glass bases, reinforced glass bases (including crystallized glass bases, etc.), ceramic bases and the like. Silicon bases, carbon bases, glass bases and crystallized glass bases can be used with particular advantages.

As mentioned above, the underlayer on the non-magnetic base preferably comprises a Cr-based non-magnetic material. The Cr-based non-magnetic material composing the underlayer may consist of Cr alone or it may be a Cr-based alloy containing Cr and another metal as main components, as is commonly employed in the technical field. As suitable Cr-based alloys there may be mentioned chromiummolybdenum (CrMo)-based alloys, and the like. For example, by adding molybdenum (Mo) to a Cr thin film which is often used as an underlayer in the prior art, it is possible to promote epitaxial growth between the underlayer and the magnetic crystal grains and promote in plane orientation of the easily magnetized axis (C axis) of the magnetic crystal grains, thus achieving excellent overwrite characteristics and high resolution.

Depending on the case, the underlayer may also be formed using a nickel (Ni)-based non-magnetic material or the like instead of a Cr-based non-magnetic material. Suitable Ni-based non-magnetic materials include NiP and NiZr alloys. Representative examples of NiP alloys are. $Ni_2P$, $Ni_3P$, etc. Such an underlayer has the effect of improving the characteristics of the magnetic layer, and especially its magnetic coercive force and recording/reproduction characteristics.

The underlayer described above may be deposited using, for example, a sputtering method such as magnetron sputtering, or another deposition method. A sputtering method is useful for controlling deposition of the alloy and its composition. The film thickness of the deposited underlayer is preferably as thin as possible, with the range of 2–20 nm being preferred. Stated in terms of the deposition rate, the range is preferably about 0.6–5 nm/sec. If the thickness of the underlayer is less than 2 nm, it cannot be expected to exhibit an effect as an underlayer. If the thickness is greater than 20 nm, it will not be possible to achieve an underlayer having a planar crystal grain size with the desired degree of fineness. The same is true if the deposition rate for the underlayer is outside of the ranges specified above.

In the magnetic recording medium of the invention, the magnetic layer that is formed on the non-magnetic underlayer may have a variety of different layer structures or compositions, so long as it satisfies the condition of comprising CoCr-based magnetic alloy particles. For example, as alluded to above, the magnetic layer may have a single-layer structure or it may have a two-layered structure or a multilayer structure of more layers. In the case of a multilayer structure, each of the magnetic layers may be constructed of the same CoCr-based magnetic alloy particles, or they be constructed of different CoCr-based magnetic alloy particles.

CoCr-based magnetic alloys that may be advantageously used to form the magnetic layer when carrying out the present invention include CoCr-based magnetic alloys commonly used for formation of magnetic layers in the technical field. An example of a CoCr-based magnetic alloy among these that may be advantageously used is CoCrPt alloy composed mainly of Co. That is, a preferred CoCr-based magnetic alloy used for the invention contains Cr as well as Pt, in addition to Co as the main component.

The Pt contained in such a CoCr-based magnetic alloy has the effect of increasing the anisotropic magnetic field (Hk) and raising the magnetic coercive force. Since this effect is more notable when the Pt content is 6 at % or greater, the present invention also preferably has a Pt content in a high proportion of 6 at % or higher, from the standpoint of improved magnetic coercive force. According to the invention, the preferred range for the Pt content when a CoCr-based magnetic alloy such as described above is used is greater than 6 at % and no greater than 12 at %.

From the standpoint of controlling the composition and properties, it is useful for the magnetic layer of the invention to comprise a ternary alloy such as the aforementioned CoCrPt alloy. If necessary, however, the magnetic layer may also be advantageously constructed of other CoCr-based magnetic alloys. Other Co-based magnetic alloys that can be advantageously used include, for example, alloys that are CoCrPt-based alloys composed mainly of Co, with tungsten (W), carbon (C), tantalum (Ta), niobium (Nb) or the like also added thereto alone or in combinations.

The aforementioned CoCr-based magnetic alloys may be quaternary or quinary alloys that contain Co as the main component, that include 14–23 at % of Cr and 1–20 at % of Pt, and have W and/or C further combined therewith. More specifically, such alloys can be represented by the following formula.

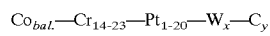

$$Co_{bal.}\text{—}Cr_{14-23}\text{—}Pt_{1-20}\text{—}W_x\text{—}C_y$$

where $bal.$ means a balancing amount, and x+y is 1–7 at %.

Further examples of the aforementioned CoCr-based alloys are quaternary or quinary alloys that contain Co as the main component, that include 13–21 at % of Cr and 1–20 at % of Pt, and have Ta and/or Nb further combined therewith. More specifically, such alloys can be represented by the following formula.

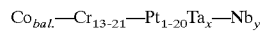

$$Co_{bal.}\text{—}Cr_{13-21}\text{—}Pt_{1-20}Ta_x\text{—}Nb_y$$

where $bal.$ means a balancing amount, and x+y is 1–7 at %.

In the magnetic recording medium of the invention, a sputtering method such as magnetron sputtering, or another deposition method, may be used for deposition of the magnetic layer. A sputtering method is useful for controlling deposition of the alloy and its composition. The film thickness of the deposited magnetic layer is preferably in the range of 5.4–20 nm. Stated in terms of the deposition rate, the range is preferably about 0.6–5 nm/sec. If the thickness of the magnetic layer is less than 5.4 nm, it cannot be expected to exhibit an effect as a magnetic layer. If the thickness is greater than 20 nm, it will not be possible to achieve a high recording density of 10 GB/in$^2$ or greater. The same is true if the deposition rate for the underlayer is outside of the ranges specified above.

As mentioned above, the magnetic layer of the magnetic recording medium of the invention is constructed of CoCr-based magnetic alloy particles, and a non-magnetic metal element with an effect of reducing the magnetic interaction between the magnetic particles is preferably segregated by diffusion at the grain boundaries of the magnetic layer. The non-magnetic metal element is preferably a single elemental substance such as Cr, Mo, C or the like since it must be easily diffusible or, stated differently, it is preferably not a compound with a low diffusion coefficient.

According to the invention, the diffusion of the non-magnetic metal element between the magnetic particles may be accomplished by any of a number of techniques. One preferred method is a method wherein the non-magnetic metal element to be diffused depends on the non-magnetic metal already contained in the magnetic layer, and annealing is performed after deposition of the magnetic layer, to diffuse the non-magnetic metal at the grain boundaries of the magnetic particles. Since the magnetic layer of the invention already contains Cr, this method is particularly advantageous when carrying out the invention. The annealing, i.e. post-annealing in this case, is preferably carried out at a temperature at which the crystallomagnetic anisotropic magnetic field of the magnetic layer is not reduced, which is a temperature of below 600° C., preferably 100–500° C., and more preferably around 450° C.

Another preferred method is one wherein the non-magnetic metal is discharged by diffusion from the metal discharge layer adjacent to the underlayer or magnetic layer, and is diffused at the grain boundaries of the magnetic layer. The metal discharge layer may be situated directly over the magnetic layer.

If necessary, the magnetic recording medium of the invention may also have a protective layer of a type commonly employed in the technical field, as the upper layer, and usually over the aforementioned magnetic layer. As suitable protective layers there may be mentioned, for example, layers composed of carbon (C) alone or its compounds, such as a carbon layer, WC layer, SiC layer, $B_4C$ layer or hydrogen-containing carbon layer, or a diamond-like carbon (DLC) layer which has recently been of interest particularly because of its high hardness. Carbon or DLC protective layers can be used with particular advantages when carrying out the present invention. Such a protective layer can usually be formed by a common method, such as sputtering, vapor deposition or the like.

When a sputtering method, such as RF magnetron sputtering, for example, is used for deposition of the protective layer, suitable film formation conditions may be an Ar gas pressure of about 3–5 mTorr, and an output of about 600–1000 W. The base is not heated during the deposition. The film thickness of the protective layer is generally preferred to be in the range of 4–8 nm, and in terms of the deposition rate this is in the range of about 0.25–0.5 nm/sec.

In addition to the aforementioned essential layers and optional layers, the magnetic recording medium of the invention may also have additional layers that are commonly used in the technical field, or the layers that are present may be subjected to any desired chemical treatment or the like. For example, a fluorocarbon resin-based lubricant layer may be formed, or other similar treatment may be carried out.

The recording medium of the invention, and its construction and production, will be easily understood by the explanation provided above.

Another aspect of the invention lies in a magnetic disk device that employs a magnetic recording medium according to the invention. There are no particular restrictions on the structure of the magnetic disk device of the invention, but it basically encompasses devices with a recording head that records data on the magnetic recording medium, and a reproduction head that reproduces the data. In particular, the reproduction head is preferably provided with a magnetic resistance effect-type head that employs a magnetic resistance element wherein the electrical resistance is changed in response to the magnetic field strength, i.e., an MR head.

The magnetic disk device of the invention preferably has a magnetic resistance effect element and a conductive layer that supplies a sense current to the magnetic resistance effect element, and it may employ a composite magnetic head comprising a laminate of a magnetic resistance effect-type reproducing head that reads out data from the magnetic recording medium and an induction-type recording head with a pair of magnetic poles formed as thin films, that records data onto the magnetic recording medium. The magnetic resistance effect-type reproducing head may have any of various publicly known structures in the technical field, and this encompasses, preferably, AMR heads that utilize an anisotropic magnetic resistance effect and GMR heads that utilize a macromagnetic resistance effect (including spin valve GMR heads, etc.). When a magnetic disk device having the structure described above is used, it is possible to reduce the curvature of the magnetic poles of the recording head while lowering the resistance of the conductive layer, compared to conventional composite magnetic heads, and thus allow more precise and highly sensitive reading of data, so long as the off-track range is small.

EXAMPLES

The magnetic recording medium of the invention and its production process will now be explained in further detail by way of the following examples.

Example 1

A magnetic recording medium according to the invention was produced using a 2.5-inch silicon disk base with an $SiO_2$ film having an outer diameter of 65 mm, an inner diameter of 20 mm, and a thickness of 0.635 mm. The production process was carried out while maintaining a vacuum state throughout all of the steps.

A cluster tool-type DC magnetron sputtering apparatus was provided, and after evacuating all of the chambers to $1 \times 10^{-10}$ Torr, purified Ar gas was introduced and the gas partial pressure of the oxidizing component was lowered and held at no higher than $1 \times 10^{-12}$ Torr. First, in the first sputter chamber, a Cr underlayer was deposited to a thickness of 19 nm with an applied power of 100 W and a deposition rate of 5 nm/sec, while maintaining the unheated base under an Ar gas pressure of no greater than 3 mTorr. Next, in the second sputter chamber, a Co-17Cr-7Pt (at %) magnetic layer was deposited to a thickness of 14 nm with an applied power of 100 W and a deposition rate of 0.6 nm/sec, while still maintaining the unheated-base under the same gas pressure as for deposition of the underlayer. The base was then heated to 450° C. for post-annealing in a carrier chamber while maintaining the vacuum. Finally, in the third sputter chamber, a carbon protective film was formed to a thickness of 8 nm, with an applied power of 600 W and a deposition rate of 0.25 nm/sec, under the same Ar gas pressure. A magnetic recording medium with the layer structure shown in FIG. 1 was obtained.

When a transmission electron microscope (TEM) was used to observe the micro cross-sectional structure of the polycrystalline particles of the underlayer of the resulting magnetic recording medium and the micro cross-sectional structure of the magnetic particles of the magnetic layer formed thereon, it was confirmed that one magnetic particle had been formed along the crystal axis of each crystal grain of the underlayer. That is, in this example, it was possible to achieve growth of magnetic grains on the crystal grains of the underlayer without altering the planar size thereof.

In the case of this example, these results were dependent on:

(1) suppressing formation of an interlayer on the outer surface of the crystal grains of the underlayer (primarily an oxidation reaction layer between the oxidizing component in the residual gas present in the vacuum and the crystal grains of the underlayer) prior to deposition of the magnetic layer, and (2) suppressing transfer of energy by migration of flying magnetic particles on the base surface during deposition of the magnetic layer. Specifically, it was possible to realize (1) by reducing the base pressure (to no greater than $1 \times 10^{-10}$ Torr) and purifying the Ar gas used for discharge in the sputtering, to reduce the partial pressure of the oxidizing gas component to no greater than $1 \times 10^{-12}$ Torr. It was possible to realize (2) by performing the deposition at room temperature, without heating the base.

Example 2

The procedure described in Example 1 was repeated, but in this example a deposition rate of 0.6 nm/sec was used instead of 5 nm/sec as the deposition rate for the 19 nm-thick Cr underlayer. In Example 1 it was possible to obtain crystal grains with a planar size of about the same value as the film thickness, but in this example the lower deposition rate allowed the planar size of the crystal grains to be reduced.

As will be appreciated from the above detailed descriptions of the present invention, according to the invention it has become possible to independently control magnetic grain size and segregation of a non-magnetic substance at the crystal grain boundaries of a magnetic layer, thereby allowing simplification of the complicated development parameters for higher performance medium-forming techniques by promoting microcrystallization of magnetic grains and grain boundary segregation of non-magnetic substances, and thereby speeding progress in technical development. The magnetic recording medium provided by the invention also has a very high magnetic coercive force, and therefore allows high recording density for advantageous use in HDDs in particular.

What is claimed is:

1. A magnetic recording medium comprising a non-magnetic base and a non-magnetic underlayer and a magnetic layer formed in that order on the base, wherein said underlayer comprises a non-magnetic polycrystalline material, composed of chromium or an alloy thereof and has a thickness of 2 to 20 nm and said magnetic layer comprises magnetic alloy particles comprising cobalt and chromium and being mainly composed of cobalt, wherein the planar size of said magnetic alloy particles is defined by the planar size of the polycrystalline particles composing said underlayer, and is no greater than 20 nm.

2. A magnetic recording medium according to claim 1, in which the magnetic alloy of said magnetic layer further contains platinum.

3. A magnetic recording medium according to claim 1, in which said magnetic layer is deposited on the base in a vacuum under non-heated conditions.

4. A magnetic recording medium according to claim 3, in which a sputtering method is used for deposition of said magnetic layer.

5. A magnetic recording medium according to claim 1, in which said magnetic layer contains a non-magnetic metal element diffused in and segregated at the grain boundaries of said magnetic alloy particles.

6. A magnetic recording medium according to claim 5, in which said non-magnetic metal element is one member selected from the group consisting of chromium, molybdenum and carbon.

7. A magnetic recording medium according to claim 5, in which said non-magnetic metal element is diffused in and segregated at the grain boundaries of said magnetic alloy particles by first depositing said magnetic layer on the base in a vacuum under non-heated conditions, and then further annealing it while maintaining the vacuum state.

* * * * *